United States Patent
Lin et al.

(10) Patent No.: US 9,128,384 B2
(45) Date of Patent: Sep. 8, 2015

(54) METHOD OF FORMING A PATTERN

(71) Applicant: TAIWAN SEMICONDUCTOR MANUFACTURING COMPANY, LTD., Hsin-Chu (TW)

(72) Inventors: Yu Chao Lin, Rende Township, Tainan County (TW); Chia-Hao Hsu, Hsinchu (TW); Kuo-Yu Wu, Toufen Township, Miaoli County (TW); Chia-Jen Chen, Chiayi (TW); Chao-Cheng Chen, Shin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 173 days.

(21) Appl. No.: 13/673,729

(22) Filed: Nov. 9, 2012

(65) Prior Publication Data
US 2014/0134759 A1    May 15, 2014

(51) Int. Cl.
| | |
|---|---|
| *H01L 21/66* | (2006.01) |
| *H01L 21/312* | (2006.01) |
| *G03F 7/40* | (2006.01) |
| *G03F 7/00* | (2006.01) |
| *G03F 7/075* | (2006.01) |
| *G03F 7/09* | (2006.01) |
| *G03F 7/095* | (2006.01) |
| *H01L 21/033* | (2006.01) |
| *H01L 21/3213* | (2006.01) |

(52) U.S. Cl.
CPC ............. *G03F 7/40* (2013.01); *G03F 7/0035* (2013.01); *G03F 7/0752* (2013.01); *G03F 7/091* (2013.01); *G03F 7/095* (2013.01); *H01L 21/0337* (2013.01); *H01L 21/32139* (2013.01)

(58) Field of Classification Search
CPC ............... G03F 1/00; G03F 7/00; G03F 7/40; G03F 7/0752; G03F 7/095; G03F 7/0035; H01L 21/00337; H01L 21/32139; H01L 21/331; H01L 21/338
USPC .................................................. 438/14, 694
See application file for complete search history.

(56) References Cited

U.S. PATENT DOCUMENTS

| | | | | |
|---|---|---|---|---|
| 6,428,894 | B1* | 8/2002 | Babich et al. | 428/408 |
| 7,253,113 | B2* | 8/2007 | Cheng | 438/703 |
| 7,328,418 | B2* | 2/2008 | Yamashita et al. | 700/121 |
| 8,053,323 | B1 | 11/2011 | Lin et al. | |
| 8,153,351 | B2* | 4/2012 | Wallow et al. | 430/315 |
| 8,772,183 | B2* | 7/2014 | Hsieh et al. | 438/798 |
| 8,912,097 | B2 | 12/2014 | Martin et al. | |
| 2005/0219484 | A1 | 10/2005 | Chiang et al. | |
| 2006/0046483 | A1* | 3/2006 | Abatchev et al. | 438/689 |
| 2009/0142931 | A1* | 6/2009 | Wang et al. | 438/734 |

\* cited by examiner

*Primary Examiner* — Savitr Mulpuri
(74) *Attorney, Agent, or Firm* — Haynes and Boone, LLP

(57) ABSTRACT

An embodiment of a method of forming a substrate pattern including forming a bottom layer and an overlying middle layer on the substrate. A photo resist pattern is formed on the middle layer. An etch coating layer is deposited on the photo resist pattern. The etch coating layer and the photo resist pattern are used as a masking element to pattern at least one of the middle layer and the bottom layer. The substrate is etched to form the substrate pattern using the at least one of the patterned middle layer and the patterned bottom layer as a masking element. The substrate pattern may be used as an element of an overlay measurement process.

16 Claims, 7 Drawing Sheets

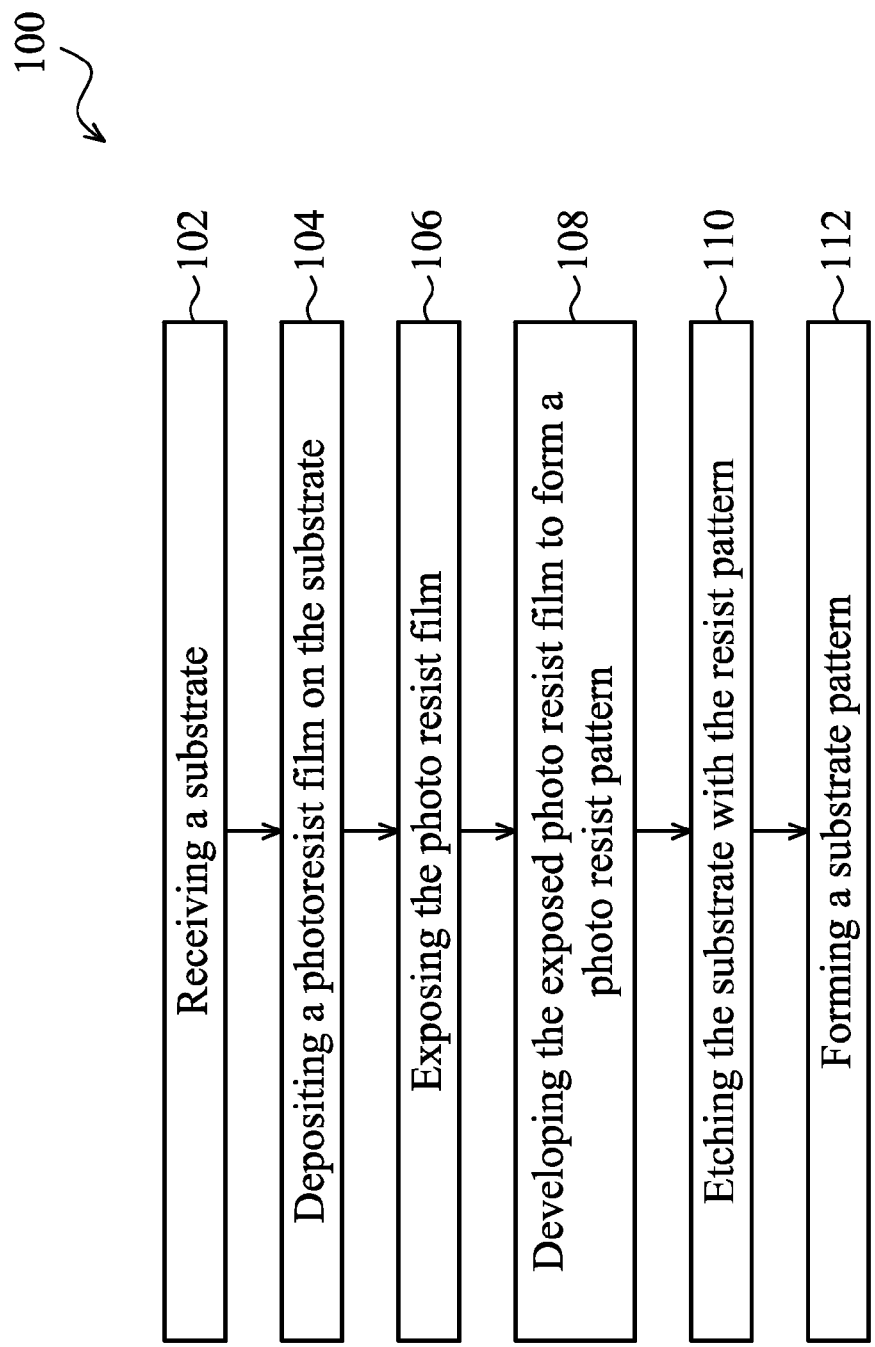

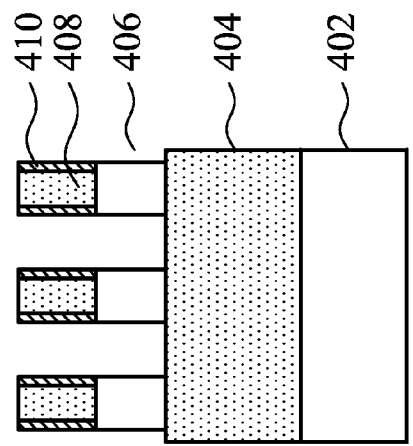
FIG. 8
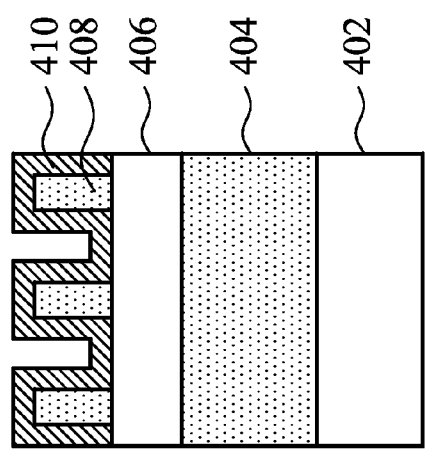
FIG. 9
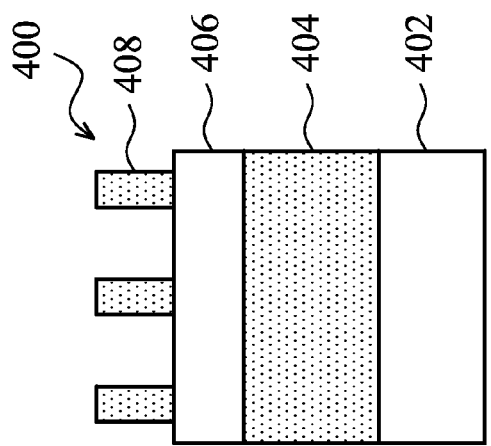
FIG. 10
FIG. 11
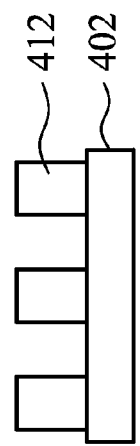
FIG. 12
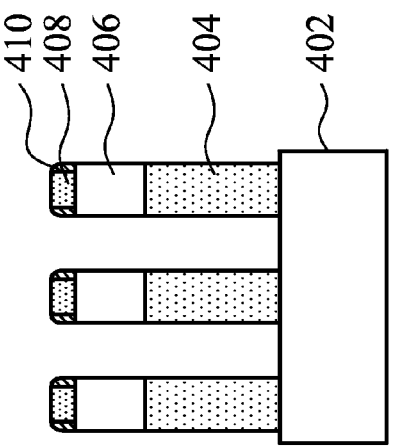
FIG. 13

METHOD OF FORMING A PATTERN

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

For example, the scaling down of a pattern may cause an unsymmetrical pattern profile on an IC device. The unsymmetrical pattern may cause issues such as a non-correctable or uncontrollable pattern-to-pattern overlay error on the IC device. In another example, an accuracy of a lithography exposing tool is impacted when using a monitor wafer with an unsymmetrical pattern monitoring or calibrating the lithography exposing tool. Accordingly, what is needed is a method forming a more symmetrical pattern.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

FIG. 1 is a flow chart of a method of forming a pattern in a substrate.

FIGS. 8-13 are cross sectional views of an embodiment of a pattern formed on a substrate using one or more embodiments of the present disclosure.

DETAILED DESCRIPTION

Figure 3:
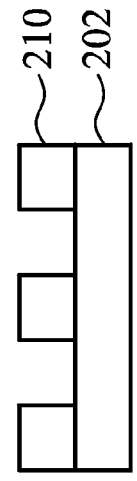
FIGS. 2-5 are cross sectional views of forming a pattern according to the method of FIG. 1.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, a conventional method 100 for forming a pattern on a substrate, such as a semiconductor wafer or photomask, is illustrated. The method 100 begins at step 102 by providing or receiving a substrate. The method 100 proceeds to step 104 by depositing a photo resist film on the substrate, for example, by a spin-on coating process. In the present disclosure, a photo resist is also referred to as a resist.

The method 100 proceeds to step 106 and exposing the photo resist film deposited over the substrate by a lithography exposing tool to form a latent image pattern on the resist film. The method 100 proceeds to step 108 by developing the exposed photo resist film to form a photo resist pattern over the substrate.

Figure 2:
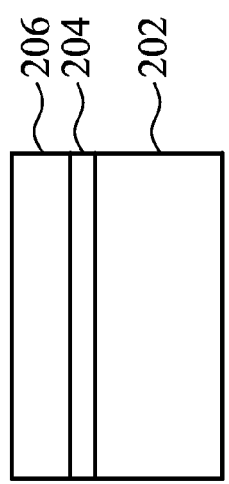

The method 100 proceeds to step 112 by etching the substrate using the patterned photo resist. Referring now to FIGS. 2-5, cross-sectional side views of forming a pattern of a device 200 using the method 100 are illustrated. As shown in FIG. 2, after receiving a substrate 202, a BARC layer 204 is deposited on the substrate 202. The substrate 202 may include a wafer and a plurality of conductive and non-conductive thin films formed thereon.

As shown in FIG. 2, the photo resist film 206 is deposited on a BARC layer 204 deposited on the substrate 202. Then, as shown in FIG. 3, the photo resist film 206 is exposed by a lithography exposing tool 230. In the present disclosure a lithography exposing tool is also referred to as an exposing tool. The lithography exposing tool 230 generates a patterned electromagnetic radiation 232 projected on the photo resist film 206.

Figure 5:
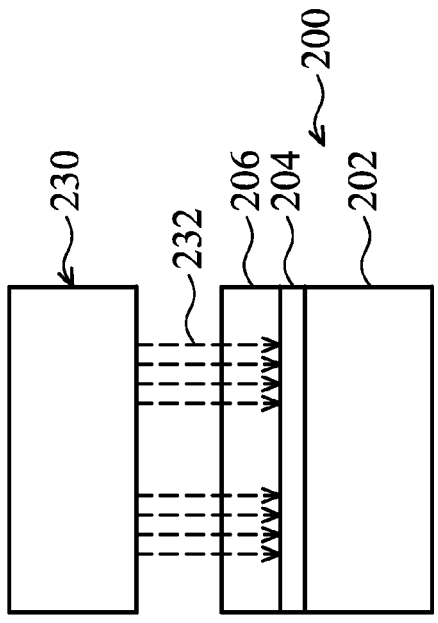
Figure 4:
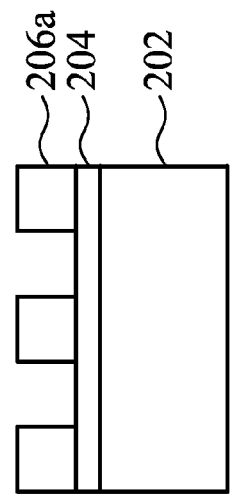

As shown in FIG. 4, after applying a developer, a photo resist pattern 206a is formed. As shown in FIG. 5, after performing an etching process a pattern 210 is formed on the substrate 202.

Figure 6:
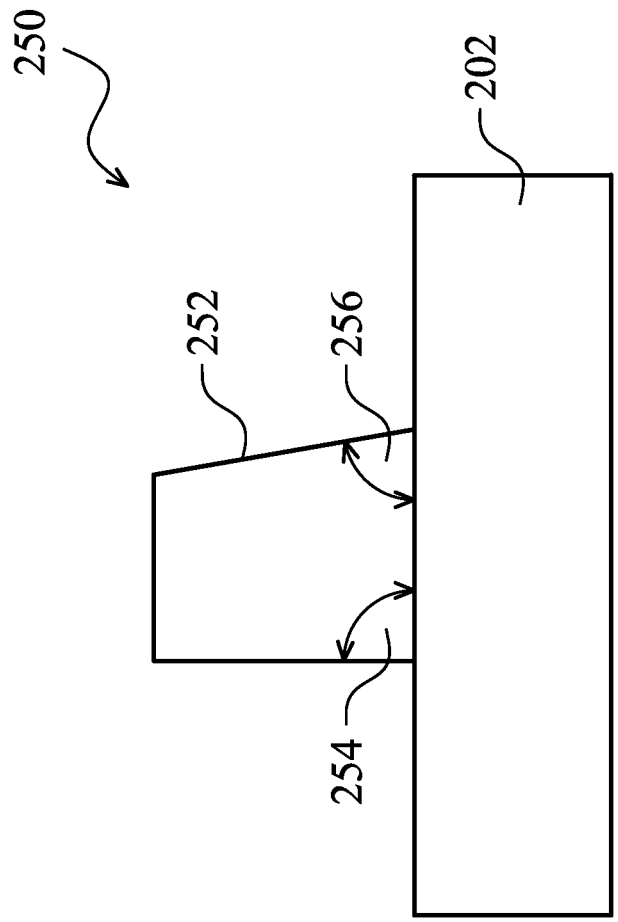
FIG. 6 is an example of a pattern profile provided by the method of FIG. 1.

Continuing with the present embodiment, FIG. 6 is an example of a pattern profile 252 formed on the substrate 202. The pattern profile 252 is not symmetric. In other words, a first side wall angle (SWA) 254 of the pattern profile 252 is not equal to a second SWA 256 of the pattern profile 252.

A non-symmetric SWA may create potential issues for a device. For example, the non-symmetric SWAs may cause critical dimension (CD) variation between a center and an edge area of a wafer out of a tolerance range or ort of a specification for a device. The CD variation between the center and the edge area of a wafer may severely impact electrical performance of a device. In one example, during exposing a wafer on a lithography exposing tool, a photo mask or a reticle (having a current pattern) is aligned to a previous pattern formed on a wafer. The alignment is performed by reading a plurality of alignment marks (or patterns) formed as previous patterns. If the reading is from non-symmetric SWA pattern, a misalignment may happen. The misalignment may be a wafer yield killer defect in a fab. In another example, in the fab, a plurality of patterned wafers is used to monitor a lithography exposing tool or process, or calibrate a lithography exposing tool. If the patterns formed on the wafer have non-symmetric SWAs, an accuracy of the lithography exposing tool or process may be impacted by the non-symmetric SWAs of the patterns.

Figure 7:
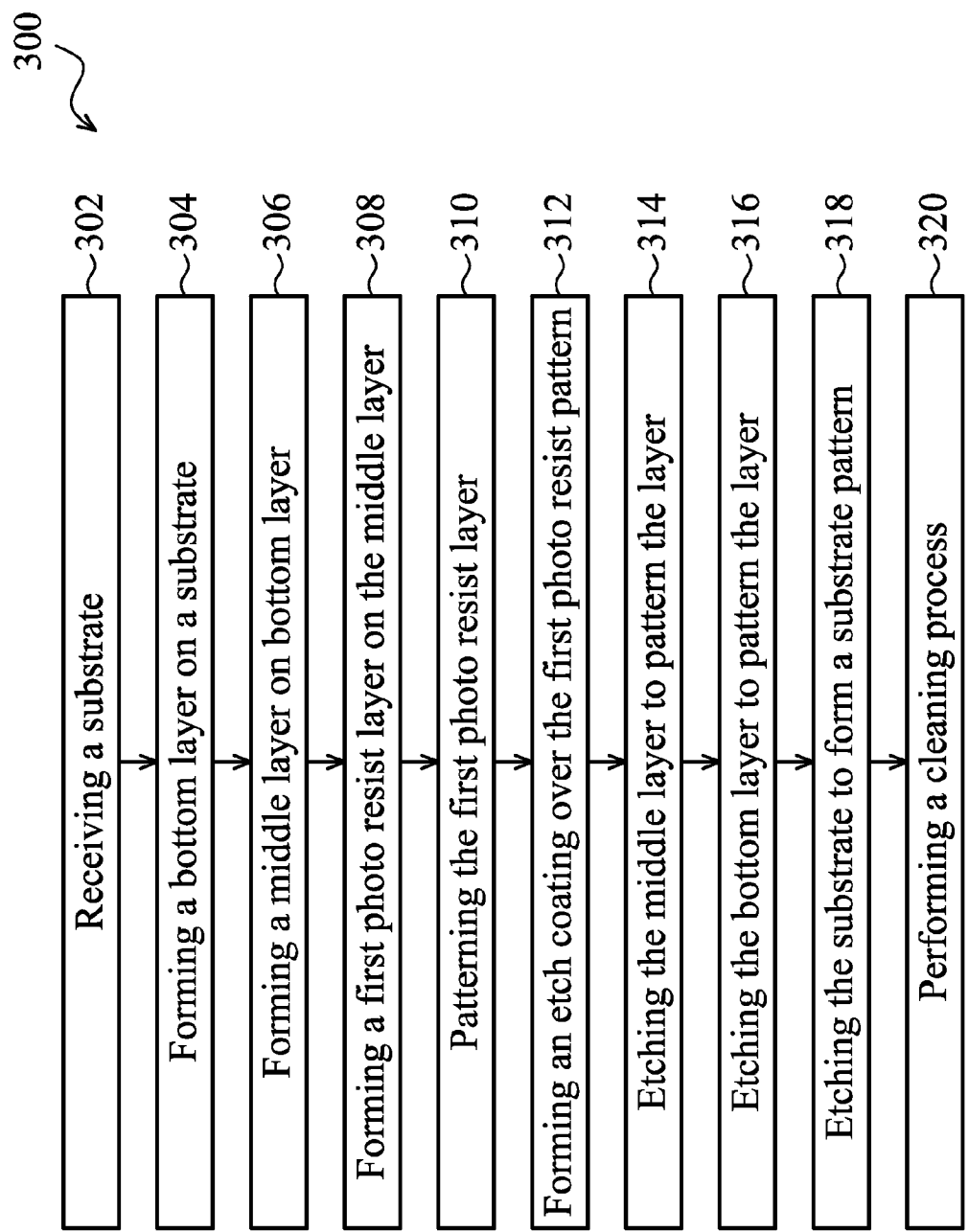
FIG. 7 is a flow chart of an embodiment of a method of forming a pattern according to one or more aspects of the present disclosure.

Referring to FIG. 7, a flow chart of a method 300 of forming a pattern according to one or more embodiments of the present disclosure. The method 300 may alleviate and/or reduce the non-symmetric SWA discussed above. FIGS. 8-13 are cross sectional views of forming a pattern of an exemplary device 400 according to an embodiment of the method 300.

The method 300 begins at step 302 by providing or receiving a substrate. Referring to the example of FIG. 8, a substrate 402 is illustrated. The substrate 402 may include a wafer and a plurality of conductive and non-conductive thin films. In an embodiment, the substrate 402 is a semiconductor substrate including silicon (in other words, a silicon wafer). Alternatively or additionally, the substrate 402 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP. In yet another alternative, the wafer is a semiconductor on insulator (SOI). The plurality of conductive and non-conductive thin films may comprise an insulator or a conductive material. For example, the conductive material comprises a metal such as aluminum (Al), copper (Cu), tungsten (W), nickel (Ni), titanium (Ti), gold (Au), and platinum (Pt) and, thereof an alloy of the metals. The insulator material may include silicon oxide and silicon nitride. In alternative embodiments, the substrate 402 may include a photomask.

The method 300 then proceeds to step 304 where a bottom layer is formed on the substrate, for example, by a spin-on coating process. Step 304 may include performing a dehydration process to enhance an adhesion of the bottom layer to the substrate. The dehydration process may include baking the substrate at a high temperature for a duration of time, or applying a chemical such as hexamethyldisilizane (HMDS) to the substrate. Exemplary bottom layer compositions include photoresist or other organic photosensitive materials. The thickness of the bottom layer may be between approximately 1500 and 3000 Å. Referring to the example of FIG. 8, a bottom layer 404 is disposed on the substrate 402.

The method 300 then proceeds to step 306 where a middle layer is formed on the bottom layer. In an embodiment, the middle layer is formed by a spin-on coating process. The step 306 may include a soft bake (SB) process. Exemplary middle layer compositions include a silicon (Si) doped BARC layer. The BARC layer may include an organic BARC or an inorganic BARC layer. In a further embodiment, the Si-doped BARC layer may include between approximately 1 and 8 percent Si. The thickness of the middle layer may be between approximately 200 to 500 angstrom (Å). Referring to the example of FIG. 8, a middle layer 406 is disposed on the substrate 402.

The method 300 proceeds to step 308 by depositing a photo resist layer on the middle layer. The photo resist layer may be formed by a spin-on coating process. In an embodiment, the step 308 includes a soft bake (SB) process. The photo resist layer may include a positive tone resist or a negative tone resist. The photo resist layer may also include a single resist film or a multiple layer photo resist film. The photo resist layer may include an I-line or a DUV photo resist. The thickness of the photo resist layer may be between approximately 500 to 1500 Å.

The method 300 proceeds to step 310 where the photo resist layer, described above with reference to step 308, is patterned. Step 310 may include exposing the photo resist layer using a lithography exposing tool. The lithography exposing tool may generate a patterned electromagnetic radiation that is projected on the photo resist layer. The lithography exposing tool may include an ultraviolet (UV) light, a deep ultraviolet (DUV) light, an extreme ultraviolet (EUV), or an X-ray light. An exemplary lithography exposing tool is a step-and-scan tool such as the ASML NXT tool (e.g., versions 1700i, 1900i, 1950i) of the ASML N.V., Nederland. In an embodiment, the lithography exposing tool uses an energy of between approximately 10 and 30 mJ. In an embodiment, the lithography exposing tool uses a focus between approximately 0.1 and −0.1. The lithography exposing tool may alternatively include a charged particle tool, such as an electron beam writer. The lithography exposing tool 230 may include a mask, such as a binary mask or a phase shift mask (PSM). The phase shift mask may be an alternative phase shift mask (alt. PSM) or an attenuated phase shift mask (att. PSM). In the present disclosure, a mask is also referred to as a photomask or a reticle.

Step 310 may also include developing the exposed photo resist layer using a developer, such as tetramethylammonium hydroxide (TMAH). Step 310 may also include a post exposure bake (PED), a post develop bake (PDB), or both. Referring to the example of FIG. 8, a patterned photo resist layer 408 is disposed on the substrate 402, overlying the bottom layer 404 and the middle layer 406.

The method 300 proceeds to step 312 by depositing an etch coating layer on the patterned photoresist layer. Referring to the example of FIG. 9, an etch coating layer 410 is formed over the patterned photo resist layer 408. In an embodiment, the etch coating layer 410 is formed using a plasma process. For example, step 312 may also include feeding a chamber of a plasma tool with an organic compound, such as $CH_4$, $CH_4F_2$, $CH_3F$, $CH_4/Ar$, or $CH_4/He$, under a low chamber pressure. In one embodiment, the etch coating layer is formed on the photo resist pattern layer 408 with a methane ($CH_4$) gas flow. The methane gas flow ranges from approximate 10 to 200 standard cubic centimeters per minute (SCCM) under the chamber pressure ranging from approximate 5 to 20 millitorr (mTorr). Other alkanes may also be used to form the etch coating layer. The etch coating layer may include carbon (C) and hydrogen (H). In another example, step 312 includes using an etching process, such as a plasma etching process involving HBr, $HBr/O_2$, or $HBr/N_2$. Referring to the example of FIG. 10, an etch coating layer 410, an etch coating layer 410 is formed on the middle layer 406 and the patterned photo resist layer 408.

The method 300 then proceeds to step 314 where the middle layer is etched or patterned. The etch coating layer 410 may also be etched in part, for example, being removed from a top surface of the patterned photo resist layer. Referring to the example of FIG. 10, the middle layer 406 is etched using the patterned photo resist layer 408 and the etch coating layer 410 as a masking element (e.g., protecting portions of the underlying layers) to provide a patterned middle layer 406. It is noted that in the illustrated embodiment, the etching stops at the bottom layer 404. In an embodiment, step 314 includes etching the middle layer using a plasma process. For example, the step 314 of etching the middle layer may include feeding a chamber of a plasma tool with a mixture of chemical gases under a low chamber pressure. For example, in one embodiment, the mixture of chemical gases includes a fluorine-containing gas, such as $CF_4$, $SF_6$, or $CH_2F_2$. A flow rate of the mixture of chemical gases may range from approximate 10 to 100 SCCM. A chamber pressure may range from approximately 1 to 20 mTorr. These process parameters are provided by way of example and not intended to be limiting.

The method 300 proceeds to step 316 and etching of the bottom layer using the patterned photo resist layer, described above with reference to step 310, the etch coating layer, described above with reference to step 312, and/or the etched middle layer, described above with reference to step 314, as a masking element. Referring to the example of FIG. 11, the bottom layer 404 is etched to form a patterned bottom layer. In the illustrated embodiment, the etching stops at the substrate 402 (the substrate 402 may include one or more layers formed on a semiconductor wafer). In an embodiment, step 316 includes etching the bottom layer using a plasma process. For example, step 316 may include feeding a chamber of a plasma tool with a mixture of chemical gases under a low chamber pressure. In one embodiment, the mixture of chemical gases includes an oxygen-containing gas, such as $O_2$, a chlorine-containing gas, such as $Cl_2$, a bromine-containing gas, such as HBr, a sulfur-containing gas, such as $SO_2$, or combination thereof. A flow rate of the mixture of chemical gases may range from approximately 10 to 200 SCCM. The chamber pressure may range from approximately 2 to 40 mTorr. These process parameters are provided by way of example and not intended to be limiting.

The method 300 then proceeds to step 318 where the substrate is patterned or etched using the patterned photo resist layer, described above with reference to step 310, the etch coating layer, described above with reference to step 312, the etched middle layer, described above with reference to step 314, and/or the etched bottom layer, described above with reference to step 316, as a masking element. Referring to the example of FIG. 12, a pattern is etched into the substrate 402 providing substrate pattern 412. As discussed above, the substrate 402 may include any plurality of layers, for example, formed on a semiconductor wafer. The substrate pattern 412 may be formed in one or more of the layers, or into the semiconductor wafer itself. In an embodiment, step 318 etches the substrate by feeding a chamber of a plasma tool with a mixture of chemical gases under a low chamber pressure. A component or concentration of the mixture of the chemical gases may be dependent upon the composition or compositions of the substrate 402. In one embodiment, the substrate 402 includes a silicon layer or a polysilicon layer. In this case, the mixture of chemical gases may include a fluorine-containing gas, such as $SF_6$, $CH_2F_2$, $CF_4$, $NF_3$, or combination thereof. A flow rate of the mixture of chemical gases may range from approximate 10 to 100 SCCM. The chamber pressure may range from approximate 2 to 10 mTorr. These process parameters are provided by way of example and not intended to be limiting.

In an embodiment of step 318, one or more of the overlying layers may be removed concurrently with the etching of the substrate. For example, FIG. 12 illustrates that the patterned photoresist layer 408, the etch coating 410, and the middle layer 406 are removed.

The method proceeds to step 320 by performing a cleaning or etching process to remove undesired layer(s) from the substrate. Referring to the example of FIG. 14, the substrate pattern 412 is provided on the substrate 402 the overlying layer(s) having been removed. The step 320 may include using a plasma cleaning and/or a wet chemical cleaning process. Additional steps can be provided before, during, and after the method 300, and some of the steps described can be replaced, eliminated, or moved around for additional embodiments of the method 300.

In an embodiment, the substrate pattern 412 formed by the method 300 provides improved CD uniformity and side wall angel (SWA) uniformity across the substrate 402 in comparison with other methods, such as that described in FIG. 1. For example, in an embodiment, a CD range of a wafer patterned by using the method 100 is approximately 95 nanometer (nm) and a CD range of a wafer patterned by using the method 300 is approximately 10 nm. In another exemplary embodiment, a side wall angel (SWA) range of a wafer patterned by using the method 100 is approximately 15 degrees and a side wall angel (SWA) range of a wafer patterned by using the method 300 is approximately 2 degrees. The improved CD or the side wall angle (SWA) uniformity may be caused by more symmetrical pattern (e.g., pattern 412) and a smoother edge of the pattern (e.g., 412) fabricated by the method 300. Because of the improved side wall angel (SWA) range of patterns across a wafer by an embodiment of the method 300, a pattern-to-pattern overlay may be also improved.

Figure 14:
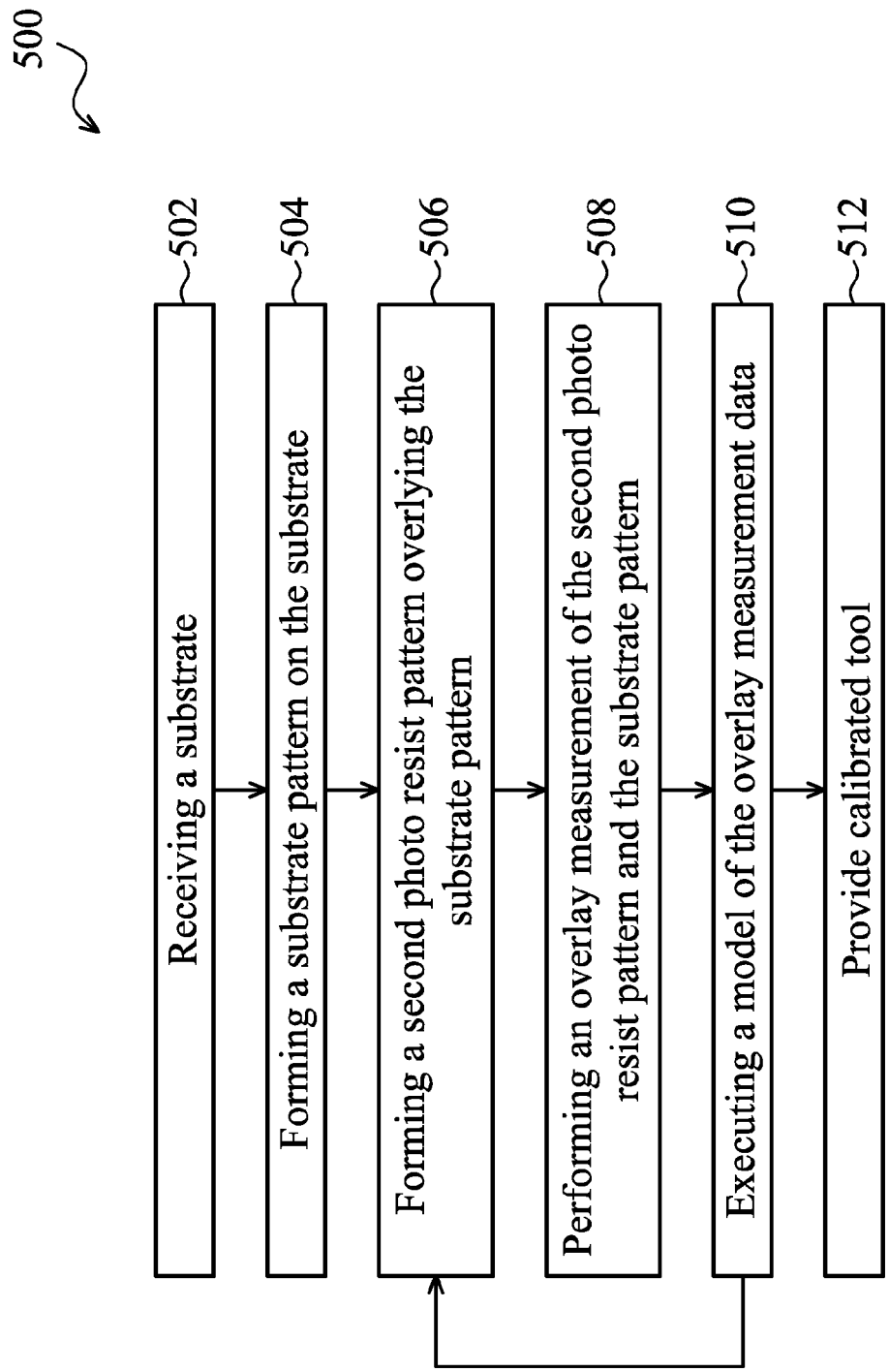
FIG. 14 is a flow chart of an embodiment of a method of calibrating a lithography exposing tool for implementing one or more embodiments of the present disclosure.

Referring to FIG. 14, a flow chart of a method 500 of calibrating or monitoring a lithography exposing tool used to provide a pattern onto a substrate. The method 500 may use a pattern fabricated by an embodiment of the method 300 or portion thereof. The method 500 begins at step 502 by receiving or obtaining a substrate. Step 502 may be substantially similar to step 302 of FIG. 7. The method 500 then proceeds to step 504 where the substrate is patterned. In an embodiment, patterning the substrate is performed using the method 300, described above with reference to FIG. 7. The step 504 may include using a first lithography exposing tool (e.g., step-and-scan tool or stepper) to form the substrate pattern on the substrate.

The method 500 then proceeds to step 506 where another photo resist pattern is formed on the substrate overlying the pattern described above with reference to step 504.

Figure 15:
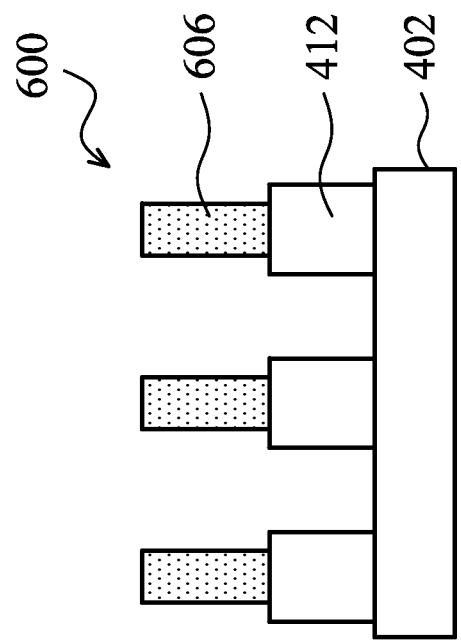
FIG. 15 is an example of an embodiment of a pattern on a substrate benefiting from one or more embodiments of the present disclosure.

Step 506 may include depositing a photo resist film on the substrate pattern, for example, by a spin-on coating process. Step 506 may include performing a dehydration process to enhance an adhesion of the bottom layer to the wafer. The dehydration process may include baking the substrate at a high temperature for a duration of time, or applying a chemical such as hexamethyldisilizane (HMDS) to the wafer. Step 506 may also include exposing the photo resist film formed on the substrate pattern using the lithography exposing tool that was also used in forming the substrate pattern described above at step 504 or a different lithography exposing tool may be used. In an embodiment, step 506 includes aligning a mask to the substrate pattern prior to exposing the photo resist film to a pattern. After exposure, a developer may be applied, such as tetramethylammonium hydroxide (TMAH), to the exposure photo resist film to form a photo resist pattern. FIG. 15, a cross-section of a device 600, is illustrative and described in detail below.

As shown in FIG. 15, a substrate pattern 412 is formed on a substrate 402. The substrate pattern 412 and/or the substrate 402 may be substantially similar to as described above with reference to FIGS. 7-13. The substrate pattern 412 may be formed using one or more processes described above in step 504, described above with reference to FIG. 14. In an embodiment, the substrate pattern 412 may be formed using a method substantially similar to the method 300, described above with reference to FIG. 7.

A photo resist pattern 606 is formed overlying the substrate pattern 412. The photo resist pattern 606 may be formed uses processes such as those described above with reference to step 506 of the method 500. In an embodiment, one or more layers may interpose the substrate pattern 412 and the photo resist pattern 606.

In an embodiment, the photo resist pattern 606 is formed using the same lithography exposing tool (e.g., stepper or step-and-scan tool) as used to form the substrate pattern 412. In another embodiment, the photo resist pattern 606 is formed using a distinct and separate lithography exposing tool. For example, the lithography exposure tools may be separate tools on a fabrication line having the same or different manufacturer or model. In an embodiment, the lithography tool used to form the substrate pattern 412 is a mother tool or a baseline tool.

Figure 16:
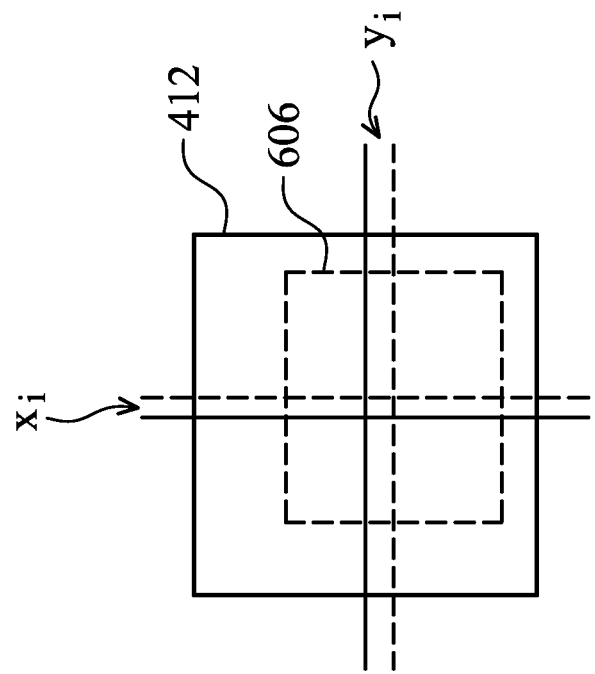
FIG. 16 is an example of a pattern to pattern misalignment.

The method 500 then proceeds to step 508 by executing an overlay measurement of the photo resist pattern formed above in step 506 with respect to the substrate pattern formed above in step 504. Referring to the example of FIG. 15, an overlay measurement of the photo resist pattern 606 to the wafer substrate pattern 412 is performed. In an embodiment, executing an overlay measurement includes measuring a difference between a center of the substrate pattern 412 and a center of the photo resist pattern 606 formed over the substrate pattern 412. This measurement may be performed using a separate overlay tool or a portion of a lithography exposing tool. In an embodiment, executing an overlay measurement includes measuring a difference in an X direction and/or in Y direction (e.g., a direction in a plane parallel a top surface of the substrate 402) between a center of the substrate pattern 412 and a center of the photo resist pattern 606 formed over the substrate pattern 412 as shown in FIG. 16, described in further detail below.

FIG. 16 is an exemplary top view of the photo resist pattern 606 printed on the substrate pattern 412, described above with reference to FIG. 16. A difference denoted $x_i$ is referred to as a misalignment of the photo resist pattern 606 to the substrate pattern 412 in X direction. A difference denoted $y_i$ is referred to as a misalignment of the photo resist pattern 606 to the substrate pattern 412 in a Y direction, substantially perpendicular to the X direction.

The method 500 proceeds to step 510 where a model of the overlay is generated. The model may be generated using measurement data $x_i$ and $y_i$. In an embodiment, generating the model includes using an algorithm to generate a set of parameters, such as an inter-translation (shift) in X/Y direction, an inter-symmetric rotation, an inter-non orthogonal rotation, an inter-expansion (scaling) in X/Y direction, an intra-symmetric rotation, an intra-asymmetric rotation, an intra-symmetric magnification, and an intra-asymmetric magnification.

In an embodiment, a misalignment (or error) in X/Y directions is within a specification, and the method 500 proceeds to step 512 to finish the monitoring (or calibrating) a lithography exposing tool.

In an embodiment, a misalignment (or error) in X/Y direction(s) is out of specification, and the method 500 proceeds back to step 506. In an embodiment, the resist pattern (e.g., 606) is stripped and reprint the photo resist pattern with the set of parameters generated by the model described above. In a further embodiment, parameters generated from a regression algorithm are fed back into a lithography exposing tool. This can be repeated for many times until the shift difference (or error) is minimized and within a specification of a lithography exposing tool or a lithography process.

Once the parameters are determined to be within specification, the method 500 proceeds to step 512 by finishing a lithography exposing tool calibration. Additional steps can be provided before, during, and after the method 500, and some the steps described can be replaced, eliminated, or moved around for additional embodiments of the method 500.

As shown in FIG. 15, in one embodiment, if the second photo resist pattern (e.g., pattern 606 of FIG. 16) is defined using a lithography exposing tool that is also used for printing the underlying substrate pattern (e.g., pattern 604 of FIG. 16), the method 500 may be used as a method of monitoring a given lithography exposing tool over time. In this embodiment, by performing the method 500, the first lithography exposing tool is monitored or calibrated.

In an embodiment, the photo resist pattern (e.g. pattern 606) is printed at a second lithography exposing tool from that of the underlying pattern (e.g., pattern 604). In such an embodiment, a tool to tool overlay (TTO) matching or as a machine to machine overly (MMO) matching may be performed. Therefore, in an embodiment, the second lithography exposing tool is calibrated to be close to the first lithography exposing tool.

Additionally, because of an improvement of a side wall angle (SWA) of the substrate pattern (first pattern) (e.g., pattern 604 as described in FIG. 16), the overlay measurement of the resist pattern to the substrate pattern (e.g. pattern 604 over pattern 606 as described in FIG. 16) is more accurate and therefore a machine to machine overlay (MMO) is also improved. For example, in an embodiment, a machine to machine overlay measurement is improved from approximately 12.6 nm in X direction shift and approximately 13.3 nm in Y direction shift to approximately 4.6 nm in X direction shift and approximately 6.5 nm in Y direction shift.

Thus, the present disclosure describes in an embodiment, a method of patterning a substrate to form a substrate pattern. The method includes receiving a substrate, forming a first photo resist pattern, depositing an etch coating layer over the first photo resist pattern formed on the middle layer, and forming the substrate pattern in the substrate by performing an etching process. Forming the first photo resist pattern may include depositing a bottom layer on the substrate, depositing a middle layer on the bottom layer, and depositing a first photo resist layer on the middle layer. Thereafter, the first photo resist layer may be exposed so that the first photo resist pattern is formed on the middle layer and the bottom layer. The method may further include performing a lithography exposing tool calibration using a second photo resist pattern printed over the substrate pattern formed in the substrate. Depositing the middle layer may include depositing a bottom antireflection coating (BARC) doped with silicon (Si). Depositing the middle layer may further include doping the BARC with the silicon (Si) ranging from approximate 1 to 8 percent in the BARC. Depositing the etch coating layer may include using a plasma process. Depositing the etch coating layer may further include using an organic alkane or a mixture of organic alkanes. Performing the etching process may include etching the etch coating layer, the middle layer, the bottom layer and the substrate.

In another embodiment, a method of forming a pattern is described. The method includes receiving a substrate, forming a first photo resist pattern, depositing an etch coating layer over the first photo resist pattern, and forming a substrate pattern in the substrate by performing an etching process. Forming the first photo resist pattern may include depositing a bottom layer on the substrate, depositing a middle layer doped with a silicon on the bottom layer, depositing a first photo resist layer on the middle layer, and forming the first photo resist pattern on the middle layer using a lithography process. Performing the etching process may include etching the etch coating layer, etching the middle layer, etching the bottom layer, and/or etching the substrate. The method may further include performing a lithography exposing tool calibration using a second photo resist pattern formed over the substrate pattern formed in the substrate. Depositing a middle layer may include depositing a bottom anti reflectance coating (BARC) doped with a Si ranging from approximate 1 to 8 percent in the BARC resist. Depositing the etch coating layer may include using a plasma process to form an organic layer.

In another embodiment described herein, a method of calibrating an exposing tool is provided. The method includes forming a substrate pattern in a substrate. Forming the substrate pattern includes providing a first patterned photo resist layer having an etch coating layer disposed thereon and using the first patterned photo resist layer to pattern an underlying layer. The patterned underlying layer is then used as a masking element when etching the substrate pattern. A second photo resist pattern is formed over the substrate pattern. An overlay measurement of the second photo resist pattern to the substrate pattern is performed.

The method may further include using a model to generate a set of correlation parameters. The underlying layer may include at least one of a photosensitive material (e.g., bottom layer) and a bottom anti-reflective coating (BARC) material (e.g. middle layer). Executing the overlay measurement may include measuring a distance between a first point on the first patterned photo resist layer and a second point on the second photoresist pattern. The distance measured may be substantially parallel a top surface of the substrate (e.g., an X or Y direction).

The method may include determining a correlation between a first lithography exposure tool and a second lithography exposure tool from the overlay measurement. In an embodiment, the patterned photo resist layer is formed using a first lithography exposure tool and the second photo resist pattern is formed using a second lithography exposure tool. The first and second lithography may be exposure tools are step-and-scan tools.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a bottom layer and a middle layer on the substrate, wherein the middle layer overlies the bottom layer;
   forming a photo resist pattern on the middle layer, wherein the photo resist pattern includes a first feature of photoresist having a top surface and two opposing sidewall surfaces;
   using a plasma process, depositing an etch coating layer including carbon on the photo resist pattern, wherein the depositing includes forming the etch coating layer over the two opposing sidewall surfaces of the first feature;
   performing a first etching process using the etch coating layer and the photo resist pattern as a masking element to pattern the middle layer;
   performing a second etching process, after the first etching process using the etch coating layer, the photoresist pattern, and the patterned middle layer to pattern the bottom layer, wherein at least a portion of the etch coating layer and the photoresist pattern remain on the patterned middle layer after the second etching process; and
   performing a third etching process of etching the substrate to form a substrate pattern in the substrate using the patterned bottom layer as a masking element, wherein the portion of the etch coating layer and the photoresist pattern is removed during the etching the substrate.

2. The method of claim 1, wherein depositing the middle layer includes depositing a bottom antireflection coating (BARC) doped with a silicon (Si).

3. The method of claim 2, wherein the silicon (Si) concentration ranges from approximately 1 to approximately 8 percent (%) in the BARC.

4. The method of claim 1, wherein the depositing the etch coating layer includes using a plasma process precursor of at least one of an organic alkane and a mixture of organic alkanes.

5. The method of claim 1, wherein performing the third etching process includes etching a silicon region of the substrate.

6. A method of forming a substrate pattern, the method comprising:
   receiving a substrate having a bottom layer including photoresist, a middle layer including a bottom antireflective coating and overlying the bottom layer, and a photo resist layer overlying the middle layer;
   patterning the photo resist layer using a lithography process;
   using a plasma deposition process, forming an etch coating layer including carbon over the patterned photo resist;
   using a first etching process, removing the etch coating layer from a top surface of the patterned photoresist while maintain the etch coating layer on the sidewalls of the patterned photoresist, and
   forming a substrate pattern in the substrate by performing an etching process, wherein performing the etching process includes;
   the first etching process which patterns the middle layer during the removing the etch coating layer from the top surface,
   thereafter performing a second etching process etching the bottom layer of photoresist wherein at least a portion of the etch coating layer and patterned photo resist remain on the etched bottom layer, and
   thereafter performing a third etching process etching the substrate wherein while removing the photo resist layer and the etch coating layer.

7. The method of claim 6, wherein forming the etch coating layer includes using the plasma deposition process having a precursor of at least one of $CH_4$, $CH_4F_2$, $CH_3F$, $CH_4/Ar$, and $CH_4/He$.

8. The method of claim 1, wherein after the using the plasma process to deposit an etch coating layer including carbon, further performing a plasma etching process on the etch coating layer prior to using the etch coating layer as the masking element.

9. The method of claim 1, wherein during the performing the first etching process, the etch coating layer is removed from a top surface of the photo resist pattern.

10. The method of claim 1, wherein the forming the bottom layer includes spin-on coating a photoresist.

11. The method of claim 1, wherein the etching the substrate includes etching a silicon layer.

12. A method comprising:
   forming a first photoresist layer on a substrate;
   forming an antireflective layer over the photoresist layer;
   forming a second photoresist layer over the antireflective layer;
   patterning the second photoresist layer to form a first feature of photoresist;
   depositing an etch coating layer including carbon on the first feature, wherein the depositing includes forming the etch coating layer on two opposing sidewall surfaces of the first feature;

performing a first etching process using the etch coating layer and the first feature as a masking element to pattern the antireflective layer;

performing a second etching process, after the first etching process, using the etch coating layer, the first feature, and the patterned antireflective layer to pattern the first photoresist layer, wherein throughout the second etching process a least a portion of each of the patterned antireflective layer, the first feature, and the etch coating layer are disposed on the substrate; and performing a third etching process of etching the substrate to form a substrate pattern in the substrate using the patterned first photoresist layer as a masking element.

13. The method of claim 12, wherein during the performing the third etching process the etch coating layer is removed during the etching the substrate.

14. The method of claim 12, wherein during the performing the third etching process the patterned antireflective layer is removed during the etching the substrate.

15. The method of claim 12, wherein during the performing the third etching process the first feature is removed during the etching the substrate.

16. The method of claim 12, wherein the depositing the etch coating layer includes using a methane ($CH_4$) gas flow in a plasma tool.

* * * * *